United States Patent
Hall et al.

(10) Patent No.: US 8,182,192 B2
(45) Date of Patent: May 22, 2012

(54) EQUIPMENT STORAGE FOR SUBSTRATE PROCESSING APPARATUS

(75) Inventors: Daniel A. Hall, West Newbury, MA (US); Christopher Hofmeister, Hampstead, NH (US); William Fosnight, Carlisle, MA (US); Jeff G. Araujo, Tyngsboro, MA (US); Steven Allen, Nashua, NH (US); Glenn Sindledecker, Dracut, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 12/843,659

(22) Filed: Jul. 26, 2010

(65) Prior Publication Data

US 2011/0014016 A1    Jan. 20, 2011

Related U.S. Application Data

(62) Division of application No. 11/485,145, filed on Jul. 11, 2006, now Pat. No. 7,762,755.

(60) Provisional application No. 60/698,222, filed on Jul. 11, 2005.

(51) Int. Cl.
*B65B 69/00*    (2006.01)

(52) U.S. Cl. ........................................ 414/411

(58) Field of Classification Search .................. 414/217, 414/411
See application file for complete search history.

(56) References Cited

U.S. PATENT DOCUMENTS

| 550,933 | A | | 12/1895 | Goetz | |
|---|---|---|---|---|---|
| 550,963 | A | * | 12/1895 | Goetz | 414/410 |
| 6,138,721 | A | * | 10/2000 | Bonora et al. | 141/98 |
| 6,220,808 | B1 | * | 4/2001 | Bonora et al. | 414/217 |
| 6,364,595 | B1 | * | 4/2002 | Bonora et al. | 414/416.1 |
| 6,612,797 | B1 | * | 9/2003 | Bonora et al. | 414/217 |
| 6,883,770 | B1 | * | 4/2005 | Miyajima et al. | 248/544 |
| 6,896,470 | B1 | * | 5/2005 | Chen et al. | 414/411 |
| 7,255,524 | B2 | * | 8/2007 | Hofmeister et al. | 414/217.1 |
| 7,607,879 | B2 | * | 10/2009 | Hall et al. | 414/217 |
| 2003/0044261 | A1 | * | 3/2003 | Bonora et al. | 414/217.1 |
| 2003/0091409 | A1 | * | 5/2003 | Danna et al. | 414/217 |
| 2005/0135906 | A1 | * | 6/2005 | Fosnight et al. | 414/277 |

* cited by examiner

*Primary Examiner* — Joshua Rudawitz
(74) *Attorney, Agent, or Firm* — Colin Durham Perman & Green, LLP

(57) ABSTRACT

A substrate processing apparatus has a frame and a load port connected to the frame and adapted to mate a substrate transport container to the frame. The apparatus has transportable storage that is adapted to be removably connected to the frame and fit beneath the load port. The storage may be an enclosure housing electrical, mechanical, or electromechanical devices of the substrate processing apparatus.

9 Claims, 6 Drawing Sheets

EQUIPMENT STORAGE FOR SUBSTRATE PROCESSING APPARATUS

CROSS-REFERENCE TO RELATED APPLICATIONS

This application is a divisional of U.S. patent application Ser. No. 11/485,145, filed Jul. 11, 2006 and claims the benefit of U.S. Provisional Patent Application No. 60/698,222, filed Jul. 11, 2005 which are incorporated herein by reference in their entirety.

BACKGROUND

1. Field

The disclosed exemplary embodiments relate to substrate processing apparatus and, more particularly, to an equipment storage for a substrate processing apparatus.

2. Brief Description of Related Developments

Operators of semiconductor fabrication facilities typically prefer manufacturing systems that function with a minimum of floorspace and volume. This allows a more compact arrangement of systems and reduced cost of ownership. Substrate processing apparatus often contain many components, such as, for example, automated components that handle individual substrates or that handle substrate transport containers. These components may be supported by controllers, power supplies, or other supporting equipment, the locations of which may be flexibly chosen without materially affecting system performance. Conventional substrate processing apparatus may, however, locate such equipment in such a way that it contributes to overall system floorspace and volume requirements. It is desirable to locate such equipment in otherwise unused or underutilized places to minimize contributions to overall system space requirements.

SUMMARY

In one embodiment, a substrate processing apparatus comprises a load port for receiving a transport container and a transportable storage adapted to fit beneath the load port, wherein the transportable storage is adapted to removably connect to another portion of the substrate processing apparatus, and wherein the transportable storage contains equipment supporting the operation of other devices in the substrate processing apparatus. In another embodiment, a substrate transport apparatus comprises a housing forming a chamber adapted to hold an isolated environment. The apparatus further comprises a docking station connected to the housing and configured to accept a substrate transport container. The apparatus still further comprises a substrate transport apparatus connected to the housing and operable to transport substrates between the chamber and a substrate transport container docked at the docking station. The apparatus yet further comprises a subframe located beneath the docking station and removably connected to the housing. The apparatus further comprises a device mounted to the subframe and connected by at least one cable to another device, the other device being connected to the housing.

BRIEF DESCRIPTION OF THE DRAWINGS

The foregoing aspects and other features of the present invention are explained in the following description, taken in connection with the accompanying drawings, wherein.

DETAILED DESCRIPTION

Figure 1:
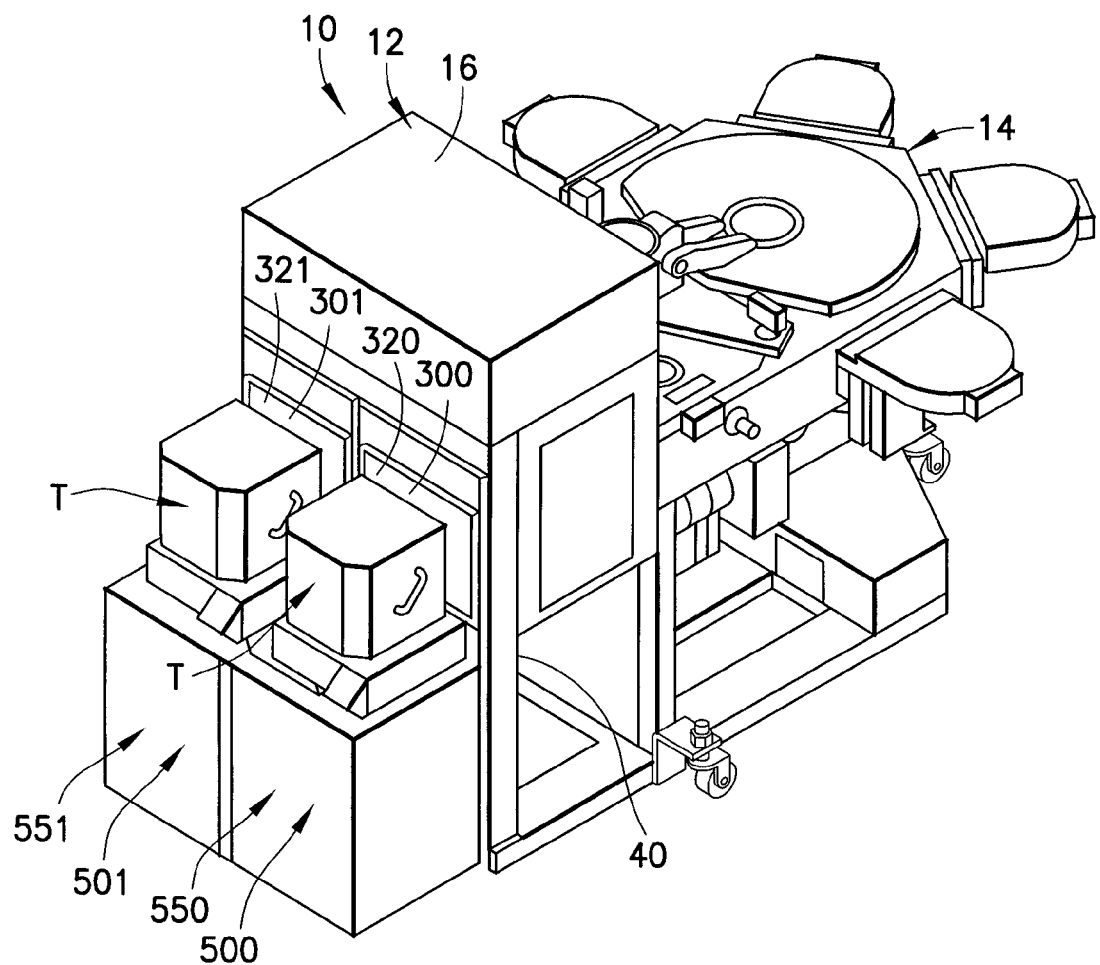
FIG. 1 is a schematic perspective view of a substrate processing apparatus incorporating features of the present invention.

Referring to FIG. 1, a perspective view of a substrate processing apparatus 10 incorporating features of the present invention is illustrated. Although the present invention will be described with reference to the embodiments shown in the drawings, it should be understood that the present invention can be embodied in many alternate forms of embodiments. In addition, any suitable size, shape or type of elements or materials could be used.

In the embodiment illustrated in FIG. 1, the apparatus 10 has been shown, for example purposes only, as having a general substrate batch processing tool configuration. In alternate embodiments, the substrate processing apparatus may have any other suitable configuration, as the features of the present invention, as will be described in greater detail below, are equally applicable to any substrate processing tool configuration including tools for individual substrate processing. The apparatus 10 may be capable of handling and processing any desired type of flat panel or substrate such as 200 mm or 300 mm semiconductor wafers, semiconductor packaging substrates (e.g. high density interconnects), semiconductor manufacturing process imaging plates (e.g. masks or reticles), and substrates for flat panel displays. The apparatus 10 may generally comprise a front section 12 and a rear section 14. The front section 12 (the term front is used here for convenience to identify an exemplary frame of reference, and in alternate embodiments the front of the apparatus may be established on any desired side of the apparatus) has a system (as will be described in greater detail below) providing an interface allowing the importation of substrates from the fab into the interior of the apparatus 10. The front section 12 also generally has a housing 16 and automation components located in the housing handling substrates between the rear section 14 and the front section interface to the exterior. The rear section 14 is connected to the housing 16 of the front section. The rear section 14 of the apparatus may have a controlled atmosphere (e.g. vacuum, inert gas), and generally comprises a processing system for processing substrates. For example, the rear section may generally include a central transport chamber, with substrate transport device, and peripheral processing modules for performing desired manufacturing processes to substrates within the apparatus (e.g. etching, material deposition, cleaning, baking, inspecting, etc.). Substrates may be transported, within the fab, to the processing apparatus 10 in containers T. The containers T may be positioned on or in proximity to the front section interface. From the containers, the substrates may be brought through the interface into the front section 12 using automation components in the front section. The substrates may them be transported, via load locks, to the atmospherically controlled rear section for processing in one or more of the processing modules. Processed substrates may then be returned, in a substantially reversed manner, to the front section 12 and then to the transport containers T for removal.

The front section 12, which may otherwise be referred to as an environmental front end module or EFEM, may have a shell or casing defining a protected, isolated environment, or mini-environment where substrates may be accessed and handled with minimum potential for contamination between the transport containers T, used to transport the substrates within the fabrication facility, and the load locks providing entry to the controlled atmosphere in the rear processing section 14. Load ports or load port modules 300,301 (one or more in number) are located on one or more of the sides of the front section providing the interface between the front section and fabrication facility. The load port modules 300,301 may have closable ports 320,321 forming a closable interface between the EFEM interior and exterior. As seen in FIG. 1, as well as in FIGS. 2, 3, and 4, the load port modules 300,301 may have docking stations or support areas 350,351 for supporting a substrate transport container T. As will be described below, a modular transportable storage 500,501 may be located beneath the support areas. The transport container support area 350,351 may allow automated movement of the transport container T supported thereon to a final or docked position. Proper placement of the transport container T on the support area, before movement, may be detected and verified with detection switches integral to the cover or casing of the support area. Positive engagement or lock down, again prior to movement, of the transport container, in the load port support area may be achieved with actuated clamps of the load port. Transport of the transport container on the support area of the load port to the final or docked position (i.e. the position of the transport container proximate to the port through which substrates are transported between the transport container and the interior of the EFEM casing interior) may be detected by a touchless (i.e. contamination free) position sensor. In cooperation with the apparatus control system, the position sensor may operate to repeatedly establish the transport container docked position with minimal clearance between container and load port frame despite tolerance variation in the dimensions of the transport container. Also, pinch detection during automated movement of the transport container may be provided. The port door 320,321, of the load port module 300,301, may engage the transport container T when in the docked position in order to open the transport container while, also opening the access port 30O in the load port frame, to provide access to substrates within the transport container as well as access for transporting the substrates between the container and EFEM interior. Engagement between the port door 320,321 and transport container T may be effected by independently operable keys 325 with independent sensors for detecting improper engagement or operation as will be described below. The port door 320,321 may be mounted on a resiliently flexible mount stably supporting the door while providing the door with sufficient range of motion when opening to clear the access port frame or other load port module structure obstructions. Additional movement of the door 320,321 to open the port for substrate transport may be accomplished with a drive that is pivoted into a position so that door movement, when opening/closing, is substantially parallel with the face of the EFEM. The load port module 300,301 may have a sensor for detecting the presence of and mapping substrates inside the transport container. The sensor is actuated to access the transport container T interior and moved to scan the interior of the transport container simultaneous with the movement of the port door to open the access port. The load port module 300,301 may be an intelligent load port module similar to that described in U.S. patent application Ser. No. 11/178,836, filed Jul. 11, 2005 incorporated by reference herein it its entirety. The load port may have an integrated user interface, communicably connected to the control system, controllers and sensors, allowing a user to locally input data, information, and programming for operation and health status monitoring of the processing apparatus. The load port module may further be provided with a camera located for viewing motions of desired automation components interior or exterior to the EFEM housing. The camera may be communicably connected to the control system, which is suitably programmed to identify from the camera signal errors in the motions of the automation components. The display of the user interface may display the view frames or video stream generated by the camera. In the exemplary embodiment, the automation components of EFEM 12, may be arranged and installed in the EFEM in what may be referred to as an automation engine, similar to that described in U.S. patent application Ser. No. 11,154,787, filed Jun. 15, 2005 incorporated by reference herein in its entirety.

Figure 2:
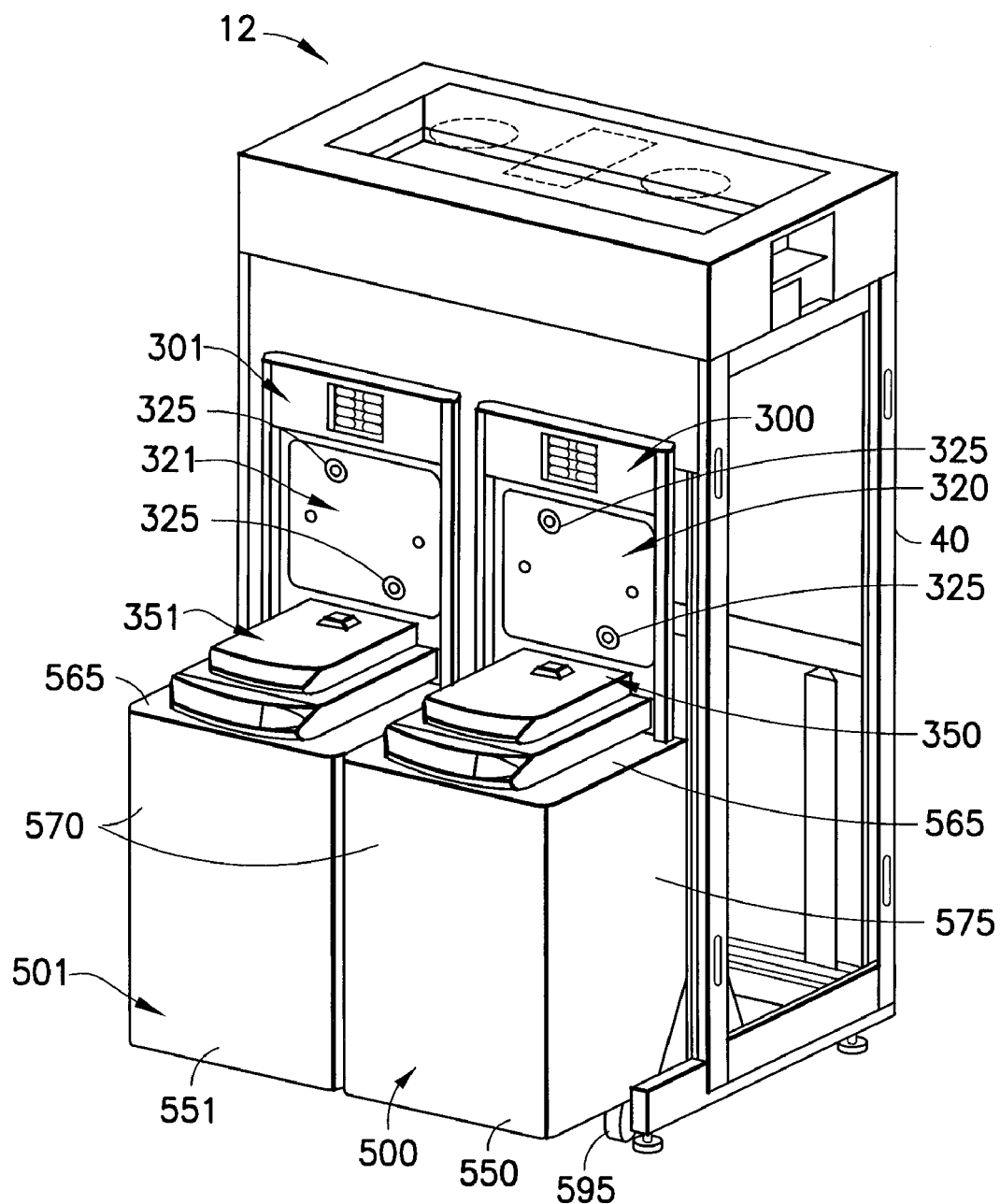
FIG. 2 is a partial schematic perspective view illustrating the environmental front end module of FIG. 1.

FIG. 2 illustrates in more detail the front section 12 of the substrate processing apparatus 10 in accordance with the exemplary embodiment. In this figure, the front section 12 is shown with a side panel removed. Two load ports 300,301 are shown on the front section 12, each with a load port door 320,321. As noted before, each load port has a transport container support area 350,351 (shown without a transport container seated thereon) upon which a transport container T may be seated as previously described. In FIG. 2, the load port door 320,321 of each load port is visible, including the keys 325 that may be used for example for opening and removing the door of a transport container seated on one of the support areas 350,351.

In the exemplary embodiment, beneath each support area 350,351 there is a storage 500,501 that is disposed within the general load port footprint for mounting desired apparatus components outside the EFEM housing as will be described in greater detail below. Each storage may comprise an enclosure 550,551 housing equipment for the operation of the substrate processing apparatus 10. For example, the enclosure 550,551 may house power supplies for providing power to devices in the front section 12, back section 14, or other location. These devices may include, for example, a substrate transport apparatus operating within the mini-environment of the front section (such as a transport apparatus operable to transport substrates between a substrate aligner in the front section, and the load ports. The devices may further include load locks connecting the front section to the rear section, substrate transport apparatus in the rear section, processing tools-, metrology tools, sensing devices, etc., or any other device within or upon the substrate processing apparatus 10. The enclosure may also house controllers for any of the above listed devices. Other electronic equipment, such as digital (or analog) signal processing equipment, signal routing equipment, or the like may also be located in the enclosures 550, 551. Mechanical or electromechanical devices, such as relays, fuses, circuit breakers, magnetic or optical disc drives, cooling fans, or other devices, may also be located in the enclosure 550,551. In other embodiments, storage 500,501 may comprise a frame that is not enclosed in whole or in part. In other embodiments, enclosure 550,551 may further comprise display devices or user interfaces mounted on the exterior thereof or otherwise mounted, such as switches, dials, display screens or other visual indicators, touch screens, keyboards, or magnetic, optical, capacitive or RFID or other radio frequency interfaces. The storage(s) 500, 501 may be removably mounted to the front section allowing for example installation and removal of each storage as a unit as will be described below. Each storage may have removable modules such as equipment drawers as will also be described below.

Figure 5:
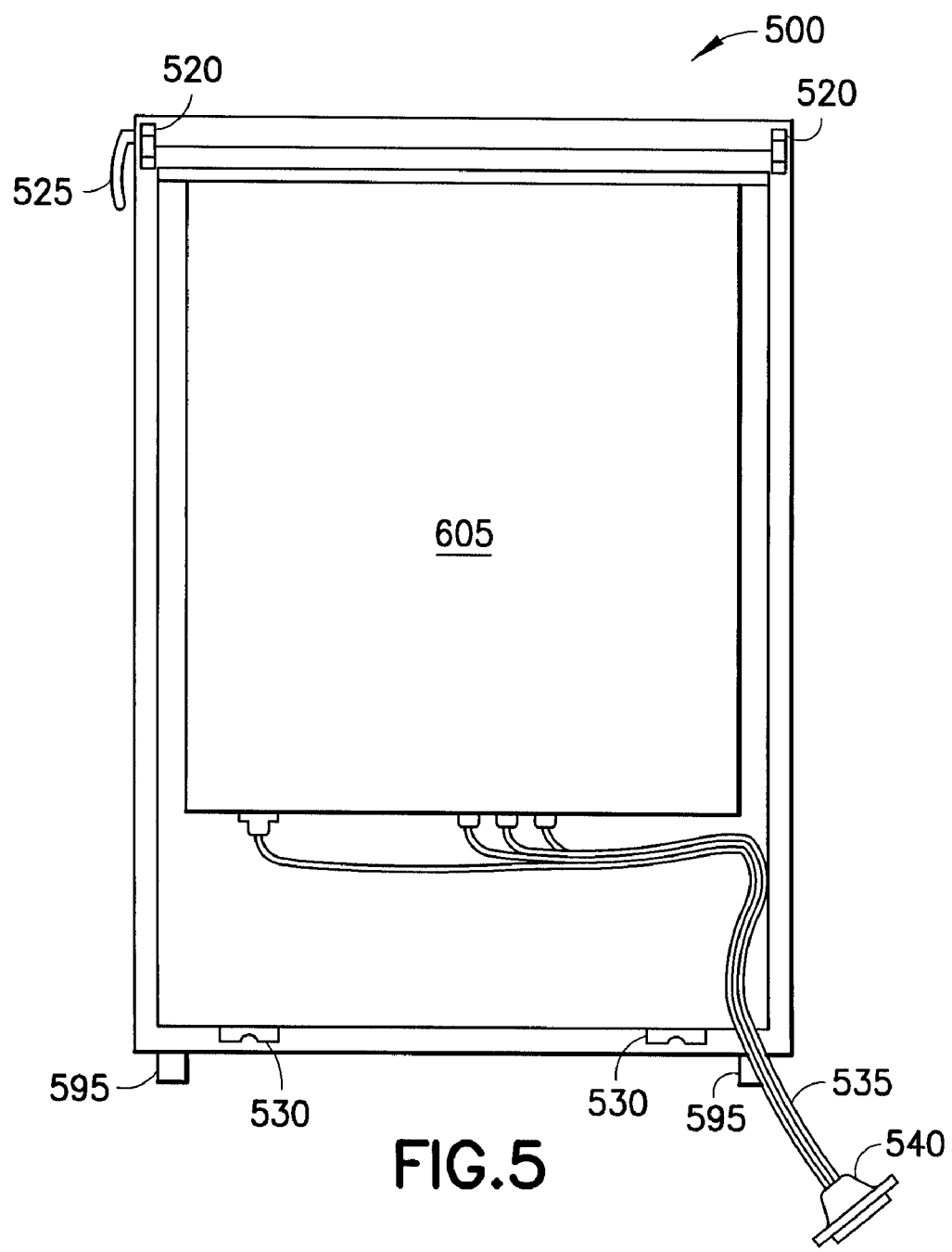
FIG. 5 is a rear schematic view showing the storage of FIGS. 1-4.

Equipment within the enclosures 550,551 may be communicably connected to other devices in the substrate processing apparatus 10 via electrically conductive, optical, or other cables or wiring, by microwave frequency waveguide or other waveguide, or by wireless technology or other methods. As shown in FIG. 5, cables 535 from the equipment may be harnessed together and terminated with a series of connectors, or alternatively, one or more bulk connectors 540. Mating connectors may be mounted on one or more plates located on the substrate processing apparatus 10 such as behind or adjacent to the enclosure 550,551, or may be mounted on the floor, or in some other location. In other embodiments, cables from the enclosure may feed into the main portion of the substrate processing apparatus via an access such as a grommeted hole or conduit. The access may, for example, be located behind the storage. The access may be directly on the substrate processing apparatus or the access may be via the floor. For example, connectivity to facility systems, such as supply of electrical power, data and voice connections to facility networks, and connections to remote switches or sensors, may be provided through the floor while connections to the rest of the substrate processing apparatus 10 are provided directly to the apparatus.

Figure 3:
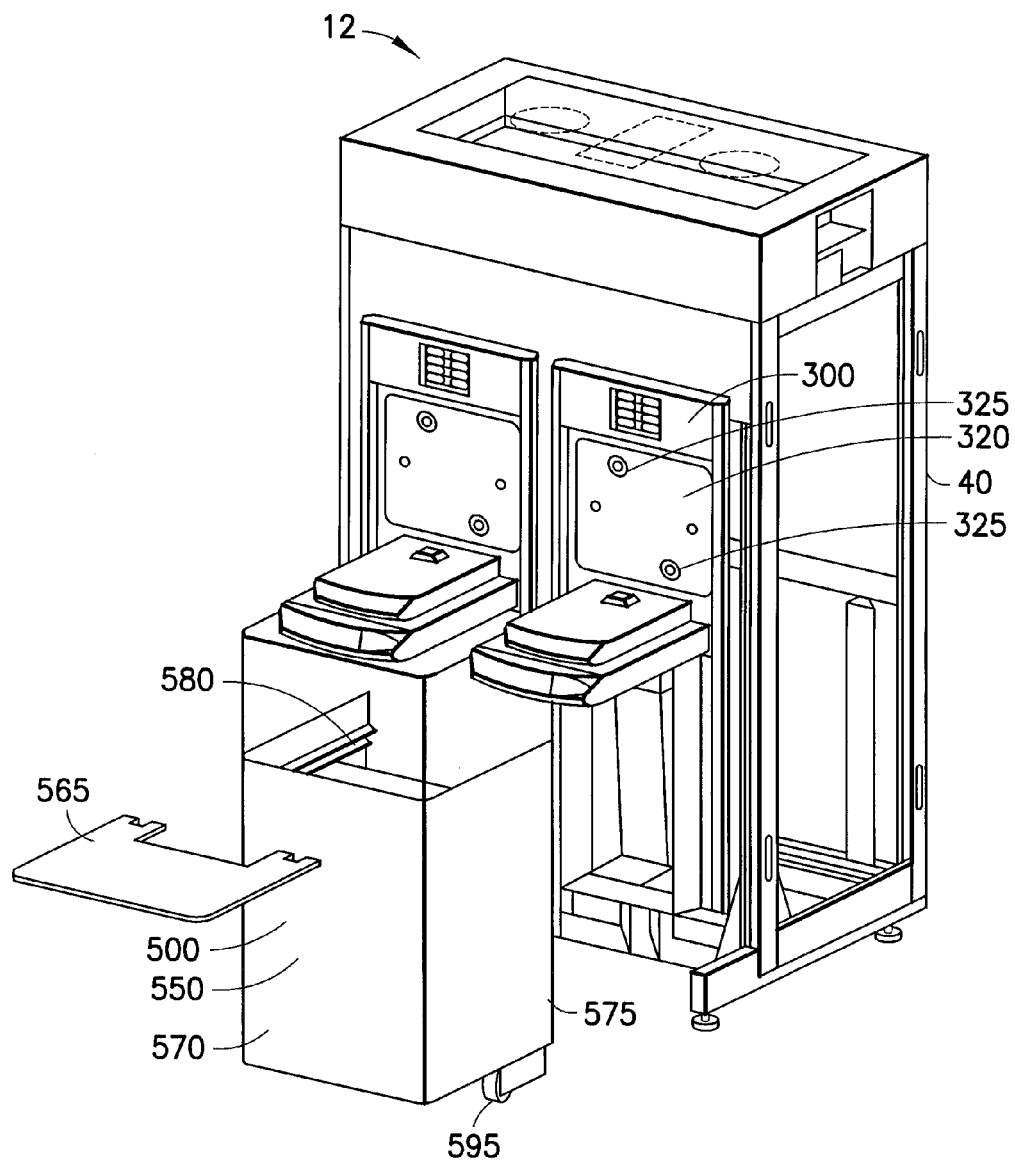
FIG. 3 is another partial schematic perspective view illustrating the environmental front end module of FIG. 1.
Figure 4:
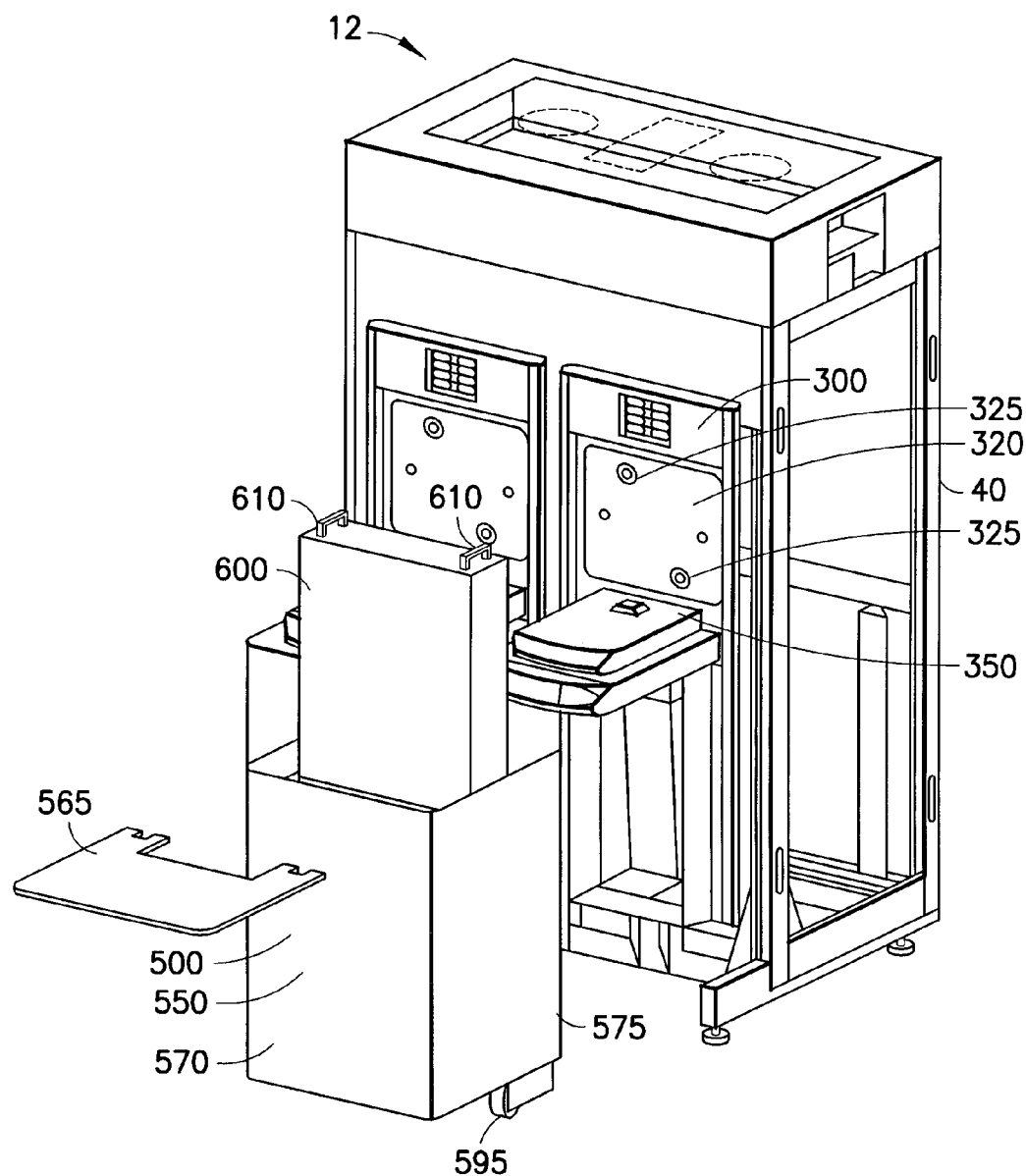
FIG. 4 is another partial schematic perspective view illustrating the environmental front end module of FIG. 1.

FIGS. 3 and 4 show additional aspects of the exemplary embodiment. Each enclosure 550,551 may be comprised of a frame 560, top panel 565, front panel 570, and side panels 575. A back panel may also be provided (not shown). Generally the hexahedron shape of the enclosures maximizes use of available space, though in alternate embodiments, the storage may have any desired shape. Any of the panels may be attached via a hinge to form a door or otherwise incorporate a door, removable panel, or the like for service access to the equipment housed in the enclosure. Each enclosure 550,551 may be incorporate an integral transport system such as wheels, rollers or casters allowing the enclosure to be independently transported on the transportation system. In the exemplary embodiment, wheels 595 may be attached to the underside of the frame. The enclosure may be self-supporting and self-transporting, with the transport system supporting the full weight of the enclosure and its contents. In alternate embodiments, the enclosure may be transportable on rails using wheels or sliders, swung on hinges, or otherwise movable to allow access to the equipment in the enclosure, or to spaces of the load ports 300,301, or the front end is hidden or blocked by the installed enclosures such as access by a service technician for maintenance or repair. Movement of the enclosure 550,551 away from the main portion of the substrate processing apparatus 10 to facilitate service access may be by manual means, or may be motorized or automated.

As noted before, in the exemplary embodiment, the enclosure(s) 550,551 is removably connected to the front section 12 by a suitable mating system. For example the enclosure may be attachable to the main portion of the front section via latching mechanisms or some other devices allowing what may be referred to as quick release and engagement. In the exemplary embodiment, the mating system may employ a general hook and latch arrangement as will be described below. As an example, FIG. 5 shows lower mounting hook points 530 at the bottom of the frame and adapted to mate with hooks on the main portion of the front section 12. In alternate embodiments the placement of the hook points and hooks may be reversed. In the exemplary embodiment, latching mechanisms 520 may be located on the upper part of the enclosure 550,551 for latching the enclosure to the main portion of the front section 12. A latch actuation handle 525 may be located on the enclosure 550,551 or on the main portion of the front section 12 for actuating the latches to catch or release the enclosure. The latches form part of a coupling interface that allows the enclosure to snap onto the main portion of the front section 12. In alternate embodiments any suitable different coupling interface may be used.

As can be seen in FIGS. 2, 3, 4, and as noted before, in the exemplary embodiment the enclosure 550,551 may be of a modular design. As shown, both enclosures are of substantially similar and interchangeable to allow either enclosure to be latched on or otherwise attached beneath either transport container support area 350,351. In addition, each enclosure 550,551 may hold modular components that may be interchangeably located in the enclosure and between enclosures. For example, FIG. 4 shows an interchangeable equipment chassis 605 (for example a 19 inch wide chassis) with two top handles 610 for manually handling the chassis. In the exemplary embodiment shown in FIGS. 2-4, the chassis 605 may be top loaded into the enclosure. In alternate embodiments, the equipment chassis may be side or front loaded. As seen in FIG. 3, the chassis 605 may be fixed within the enclosure 550,551 by attaching it to horizontal rails 580, for example in the top of the enclosure. The rails 580 may have regularly spaced fastener attachments, such as threaded holes, matching the spacing and diameter of fasteners on the chassis 605. The rails may be mounted in parallel at a standard distance apart corresponding to the chassis arrangement, for example, about 19 inches. This allows the chassis 605 to be located at any one of multiple locations along the rails. Moreover, other chassis containing different equipment may have similar width and general pattern of fasteners, allowing interchangeable location and mounting of chassis. Other embodiments may not be modular or may provide modularity in different ways. For example, the enclosure 550,551 may hold modular cards or other inserts which connect with one of multiple standardized sockets, pins, plugs, or other connecting and devices in the enclosure.

Figure 6:
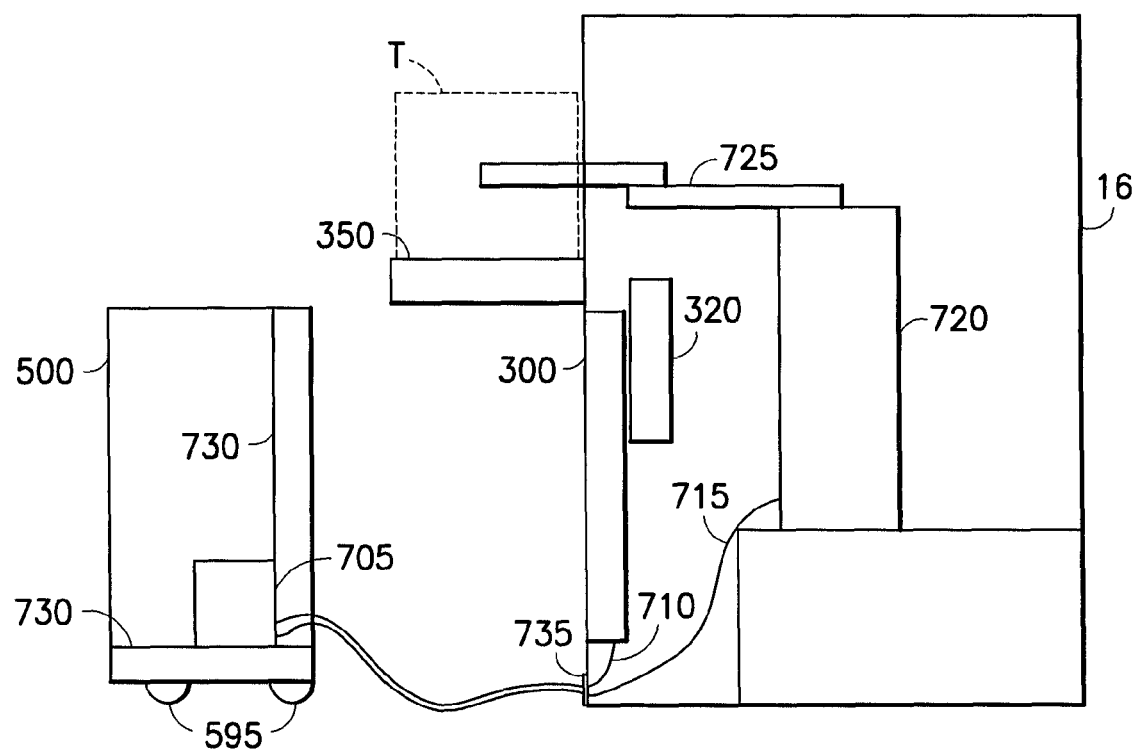
FIG. 6 is a schematic cross section illustrating various aspects of a substrate processing apparatus.

FIG. 6 is a schematic side-view illustration of the exemplary substrate processing apparatus 10 with the storage enclosure 500 in a detached position. A substrate transport apparatus 720 is connected to the front end housing 16 such as via an automation engine assembly (not shown) similar to that described in U.S. patent application Ser. No. 11/154,787, previously incorporated by reference herein. The transport apparatus 720 has an arm 725 that is operable to reach into a substrate transport container T when the transport container is docked at a docking station 350 of a load port 300. Transportable storage 500 comprising a subframe 730 that is adapted to connect to the housing 16 in a latching fashion. The transportable storage 500 has wheels 595 so that the storage may be wheeled away from the housing 16. The storage has a device 705 that may be an electrical or electronic device, such as a power supply or controller, for supporting one or more components of the processing apparatus. The device 705 is connected via cable 710 to the load port 300, and is also connected via cable 715 to the substrate transport apparatus. The cables 710, 715 may connect to their respective devices via a connector plate 735. In one embodiment, the device 705 may be adapted to supply electrical power to the load port 300 and transport apparatus 720. In another embodiment, the device 705 may be a controller interfacing via the cables 710, 715 with the load port 300 and transport apparatus 720, respectively. The cables 710, 715 may remain connecting the various devices even when the storage 500 is separated from the housing 16. Therefore, the storage 500 may be separated from the housing 16 without disrupting the operation of the load port 300, transport apparatus 720, device 705, or other parts of the processing apparatus 10. When the transportable storage 500 is separated from the housing 16, the device 705 and/or the load port 300 may be accessible from between the storage and the housing. This may allow for testing of the device 705, load port 300 or other devices as the processing apparatus is in operation. As may be realized, the arrangement shown in FIG. 6 is exemplary only. For example, in other embodiments the device 750 may communicably connect with the load port 300, transport apparatus 720, or other device via a disconnectable interface wherein separation of the storage 500 and housing 16 breaks the communicable connection at the disconnectable interface. Still other embodiments may employ any other suitable arrangement.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

The invention claimed is:

1. A substrate processing apparatus comprising:
   a frame;
   a load port connected to the frame and configured for mating a substrate transport container to the substrate processing apparatus; and
   a transportable storage configured to be removably connected to the frame and fit beneath the load port, the transportable storage including a latch configured to removably connect the storage to the frame so that the transportable storage is be separable from the frame without disrupting communication between an internal environment of the substrate transport container located on the load port and an internal environment of the substrate processing apparatus;
   wherein the transportable storage holds substrate processing apparatus components therein.

2. The substrate processing apparatus of claim 1, wherein the transportable storage has locating features for locating the storage in a predefined position relative to the frame.

3. The substrate processing apparatus of claim 1, wherein the transportable storage has locating features for locating the storage in a predefined position relative to the frame.

4. The substrate processing apparatus of claim 3, wherein the transportable storage is self-supporting.

5. The substrate processing apparatus of claim 3, wherein the transportable storage is movably supported on a support base.

6. The substrate processing apparatus of claim 5, wherein the support base is a wheeled support base.

7. The substrate processing apparatus of claim 1 wherein the substrate processing apparatus components held in the transportable storage includes a power supply or a controller.

8. The substrate processing apparatus of claim 1 wherein the storage is adapted to be moved away from the frame of the substrate processing apparatus to access an interior space of the storage.

9. The substrate processing apparatus of claim 1, wherein the storage comprises removable sub-modules that are interchangeably mounted in the storage.

* * * * *